United States Patent
Lutker-Lee et al.

(10) Patent No.: US 11,882,776 B2
(45) Date of Patent: Jan. 23, 2024

(54) IN-SITU ENCAPSULATION OF METAL-INSULATOR-METAL (MIM) STACKS FOR RESISTIVE RANDOM ACCESS MEMORY (RERAM) CELLS

(71) Applicant: Tokyo Electron Limited, Tokyo (JP)

(72) Inventors: Katie Lutker-Lee, Albany, NY (US); Angelique Raley, Albany, NY (US); Dina Triyoso, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 546 days.

(21) Appl. No.: 17/210,843

(22) Filed: Mar. 24, 2021

(65) Prior Publication Data

US 2021/0313513 A1 Oct. 7, 2021

Related U.S. Application Data

(60) Provisional application No. 63/006,437, filed on Apr. 7, 2020.

(51) Int. Cl.
*H01L 45/00* (2006.01)
*H10N 70/00* (2023.01)
*H10B 63/00* (2023.01)

(52) U.S. Cl.
CPC ......... *H10N 70/8833* (2023.02); *H10B 63/80* (2023.02); *H10N 70/021* (2023.02); *H10N 70/063* (2023.02); *H10N 70/068* (2023.02); *H10N 70/841* (2023.02)

(58) Field of Classification Search
CPC ............. H10N 70/8833; H10N 70/841; H10N 70/063; H10N 70/068; H10N 70/021
See application file for complete search history.

(56) References Cited

U.S. PATENT DOCUMENTS

| 9,431,603 | B1 | 8/2016 | Hsieh et al. |
| 9,847,473 | B2 | 12/2017 | Hsu et al. |
| 9,847,481 | B2 | 12/2017 | Chang et al. |
| 2015/0004747 | A1 | 1/2015 | Hong et al. |

(Continued)

FOREIGN PATENT DOCUMENTS

| KR | 1020140080401 A | 6/2014 |
| KR | 1020140128876 A | 11/2014 |
| WO | 2019066851 A1 | 4/2019 |

OTHER PUBLICATIONS

Korean Intellectual Property Office, The International Search Report and Written Opinion for International Application No. PCT/US2021/023856, dated Jun. 29, 2021, 8 pages.

*Primary Examiner* — Mark V Prenty

(57) ABSTRACT

Methods are provided herein for improving oxygen content control in a Metal-Insulator-Metal (MIM) stack of an RERAM cell, while also maintaining throughput. More specifically, a single chamber solution is provided herein for etching and encapsulating the MIM stack of an RERAM cell to control the oxygen content in the memory cell dielectric of the RERAM cell. According to one embodiment, a non-oxygen-containing dielectric encapsulation layer is deposited onto the MIM stack in-situ while the substrate remains within the processing chamber used to etch the MIM stack. By etching the MIM stack and depositing the encapsulation layer within the same processing chamber, the techniques described herein minimize the exposure of the memory cell dielectric to oxygen, while maintaining throughput.

20 Claims, 5 Drawing Sheets

(56) References Cited

U.S. PATENT DOCUMENTS

| | | |
|---|---|---|
| 2017/0141161 A1 | 5/2017 | Sakotsubo |
| 2018/0033961 A1 | 2/2018 | Yi et al. |
| 2018/0330945 A1 | 11/2018 | Varadarajan et al. |
| 2021/0313513 A1* | 10/2021 | Lutker-Lee .......... H10N 70/841 |

* cited by examiner

IN-SITU ENCAPSULATION OF METAL-INSULATOR-METAL (MIM) STACKS FOR RESISTIVE RANDOM ACCESS MEMORY (RERAM) CELLS

PRIORITY CLAIM

This application claims priority to U.S. Provisional Patent Application No. 63/006,437, entitled "In-situ Encapsulation of Metal-Insulator-Metal (MIM) stacks for Resistive Random Access Memory (RERAM) Cells," filed Apr. 7, 2020 the disclosure of which is expressly incorporated herein, in its entirety, by reference.

BACKGROUND

The present disclosure relates to the processing of substrates. In particular, it provides a method of etching layers on substrates.

A resistive random access memory (RRAM or RERAM) is a type of non-volatile random access memory that includes a Metal-Insulator-Metal (MIM) stack comprised of a top electrode, a memory cell dielectric and a bottom electrode. Since RERAM cells operate by changing the resistance across the memory cell dielectric, the resistive characteristics of the dielectric material utilized within the MIM stack significantly affect the performance of the RERAM cell.

The memory cell dielectric used in RERAM cells is typically implemented with a high-k dielectric material, such as hafnium oxide ($HfO_2$). For some high-k dielectric materials, the oxygen vacancy in the dielectric material is an important factor in providing the desired resistance across the memory cell dielectric. Unfortunately, various substrate processing steps are known to impact the control of oxygen vacancies in the memory cell dielectric. For example, after etching the MIM stack, the memory cell dielectric is susceptible to changes in the oxygen content of the memory cell dielectric, and accordingly, the resistive characteristics of the RERAM cell. Thus, for example, in order to control the oxygen content of the memory cell dielectric, care should be taken to avoid oxygen ingress into the memory cell dielectric.

One technique for controlling the oxygen content of the memory cell dielectric is to encapsulate the MIM stack with a non-oxygen-containing dielectric material after the MIM stack has been etched. For example, the MIM stack may be encapsulated within a silicon nitride (SiN) dielectric layer, or other non-oxygen-containing dielectric materials, to avoid oxygen ingress into the memory cell dielectric during subsequent processing steps.

FIGS. 1A-1E illustrate a conventional process flow for forming at least a portion of an RERAM cell. In particular, FIGS. 1A-E illustrate a conventional process flow for forming a Metal-Insulator-Metal (MIM) stack for an RERAM cell. As shown in FIG. 1A, RERAM cells may be fabricated by forming a bottom electrode 110 layer, a memory cell dielectric 115 layer and a top electrode 120 layer on one or more underlying layers 105. The memory cell dielectric 115 layer may be implemented with a high-k dielectric material (e.g., $HfO_2$). The top electrode 120 layer and the bottom electrode 110 layer may be implemented with a barrier metal material (e.g., TiN). As described in more detail below, the top electrode 120 layer, memory cell dielectric 115 layer and bottom electrode 110 layer may be subsequently etched to form MIM stack(s) 100 for one or more RERAM cells.

Underlying layers 105 may include any number and/or type of layers and/or structures typically used to form RERAM cells. For example, underlying layers 105 may include one or more RERAM cell gates, which are formed on a substrate containing source/drain regions for the RERAM cell(s). Underlying layers 105 may also include other layers, such as one or more dielectric layer(s) formed on the substrate and one or more conductive plugs connecting the subsequently formed MIM stack(s) 100 and overlying metal layers (not shown) to the source/drain regions of the RERAM cell(s).

Prior to etching the MIM stack(s) 100, as shown in FIG. 1C, an organic planarization layer (OPL) 125, anti-reflective coating (ARC) layer 130 and patterning layer 140 may be formed on the top electrode 120 layer utilizing known semiconductor processing steps. Patterning layer 140 may include a photoresist layer and/or a hard mask layer that has been patterned for MIM stack formation. It will be recognized, however, that any of wide variety of techniques may be utilized to form a pattern for etching the MIM stack(s) 100. Once the patterning layer 140 is formed, the structure shown in FIG. 1A may be etched to form MIM stack(s) 100 for one or more RERAM cells.

FIGS. 1B-1E illustrate example process flow steps for etching a portion 150 of the structure shown in FIG. 1A to form an MIM stack 100 for one RERAM cell. The structure shown in FIG. 1A may be disposed within an etch chamber for etching the MIM stack 100. The etch process used to form the MIM stack 100 may generally be implemented as one or more etch process steps.

To prevent ingress of oxygen into the memory cell dielectric 115 during subsequent substrate processing steps, the top electrode 120, the memory cell dielectric 115 and the bottom electrode 110 may be encapsulated with a non-oxygen-containing dielectric material layer, such as for example, silicon nitride (SiN). In the process step shown in FIG. 1D, the structure comprising the etched MIM stack 100 (FIG. 1C) is moved to another processing chamber (e.g., a deposition chamber) to deposit an encapsulation layer 145 onto the MIM stack 100 and surrounding surfaces. The encapsulation layer 145 may generally contain a non-oxygen-containing dielectric material (e.g., SiN). Once the encapsulation layer 145 is deposited, the structure comprising the encapsulated MIM stack 100 (FIG. 1D) may be moved to an etch chamber again so that another etch process (e.g., a spacer etch) may be performed to remove the encapsulation layer 245 from a top surface of the MIM stack 100 and surrounding surfaces, as shown in FIG. 1E. The etch process used to perform the spacer etch may generally be implemented as one or more etch process steps. By using a spacer etch, the encapsulation layer is left on the sidewalls of the MIM stack 100 but removed from the top of the MIM stack 100 and the top of the underlying layers 105.

In the conventional RERAM process flow shown in FIGS. 1A-1E, the structure comprising the etched MIM stack 100 is moved from the etch chamber to a deposition chamber for encapsulation with an encapsulation layer 145 containing a non-oxygen-containing dielectric material. Once the encapsulation layer 145 is deposited, the structure comprising the encapsulated MIM stack 100 is moved back to the same or a different etch chamber for additional processing. This process flow reduces throughput by requiring movement into/out of multiple process chambers and may expose the memory cell dielectric to oxygen.

It would be desirable to provide an improved process for forming an MIM stack for an RERAM cell that minimizes exposure of the memory cell dielectric to oxygen, while also maintaining throughput.

SUMMARY

Methods are provided herein for improving oxygen content control in a Metal-Insulator-Metal (MIM) stack of an RERAM cell, while also maintaining throughput. More specifically, a single chamber solution is provided herein for etching and encapsulating the MIM stack of an RERAM cell to control the oxygen content in the memory cell dielectric of the RERAM cell. According to one embodiment, a non-oxygen-containing dielectric encapsulation layer is deposited onto the MIM stack in-situ while the substrate remains within the processing chamber used to etch the MIM stack. By etching the MIM stack and depositing the encapsulation layer within the same processing chamber, the techniques described herein minimize the exposure of the memory cell dielectric to oxygen, while maintaining throughput.

In a first method, a method of forming a resistive random access memory (RERAM) is provided. The first method may comprise forming a first electrode layer, forming a memory cell dielectric layer, and forming a second electrode layer, wherein the memory cell dielectric layer is arranged between the first electrode layer and the second electrode layer. The method further comprises etching the first electrode layer, the memory cell dielectric layer and the second electrode layer to form one or more Metal-Insulator-Metal (MIM) stacks for one or more RERAM cells, wherein said etching is performed within at least one plasma etch chamber, and depositing an encapsulation layer onto the one or more MIM stacks and surrounding surfaces, wherein said depositing is performed within the at least one plasma etch chamber.

In one embodiment of the first method, the memory cell dielectric layer comprises a metal oxide selected from a group comprising of hafnium oxide (HfO), hafnium zirconium oxide (HfZrO), tantalum oxide (TaOx), aluminum oxide (AlOx), zirconium oxide (ZrOx) or titanium oxide (TiOx) and their mixtures. In another embodiment, the encapsulation layer comprises silicon (Si), silicon nitride, (SiN) oxynitride (ON), or silicon oxynitride (SiON). In another embodiment, the encapsulation layer comprises an organic material.

In yet another embodiment of the first method, said depositing comprises providing one or more precursors to the at least one plasma etch chamber to deposit the encapsulation layer onto the one or more MIM stacks and the surrounding surfaces. In one embodiment, the one or more silicon precursors comprise silicon containing gases. In a more particular embodiment, the one or more silicon precursors are selected from a group comprising of silicon tetrachloride ($SiCl_4$) and silicon tetrafluoride ($SiF_4$).

In another embodiment of the first method, the method further comprises performing a spacer etch process to remove the encapsulation layer from a horizontal surface of the one or more MIM stacks and the surrounding surfaces. In one embodiment, the spacer etch also removes any etch byproducts remaining after etching the first electrode layer, the memory cell dielectric layer and the second electrode layer. In another embodiment, said performing a spacer etch process comprises using an oxygen-free plasma etch chemistry within the at least one plasma etch chamber to remove the encapsulation layer from the horizontal surface of the one or more MIM stacks and the surrounding surfaces. In yet another embodiment, said depositing an encapsulation layer prevents ingress of oxygen into the memory cell dielectric layer when removing the encapsulation layer from the horizontal surface of the one or more MIM stacks and the surrounding surfaces by leaving the encapsulation layer on sidewalls of the MIM stack.

In a second method, a method of forming a resistive random access memory (RERAM) is provided. The second method may comprise forming a first electrode layer; forming a memory cell dielectric layer, and forming a second electrode layer, wherein the memory cell dielectric layer is arranged between the first electrode layer and the second electrode layer. The method further comprises etching the first electrode layer, the memory cell dielectric layer and the second electrode layer to form one or more Metal-Insulator-Metal (MIM) stacks for one or more RERAM cells, wherein said etching is performed within at least one plasma etch chamber. The second method also comprises depositing an encapsulation layer onto the one or more MIM stacks and surrounding surfaces, wherein said depositing is performed within the at least one plasma etch chamber. Further, the second method comprises removing the encapsulation layer from a top surface of the one or more MIM stacks and the surrounding surfaces, wherein said removing is performed within the at least one plasma etch chamber. The various embodiments described above of the first method may also be utilized as embodiments of the second method.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Methods are provided herein for improving oxygen content control in a Metal-Insulator-Metal (MIM) stack of an RERAM cell, while also maintaining throughput. More specifically, a single chamber solution is provided herein for etching and encapsulating the MIM stack of an RERAM cell to control the oxygen content in the memory cell dielectric of the RERAM cell. According to one embodiment, a non-oxygen-containing dielectric encapsulation layer is deposited onto the MIM stack in-situ while the substrate remains within the processing chamber used to etch the MIM stack. By etching the MIM stack and depositing the encapsulation layer within the same processing chamber, the techniques described herein minimize the exposure of the memory cell dielectric to oxygen, while maintaining throughput.

The techniques described herein to protect the oxygen content integrity of an RERAM cell may be utilized with a wide range of RERAM cell designs, RERAM memory cell dielectrics, RERAM encapsulation dielectrics, and RERAM process flows. It will be recognized that RERAM cell designs, RERAM memory cell dielectrics, RERAM encapsulation dielectrics, and RERAM process flows shown herein are merely exemplary and those skilled in the art will recognize many other alternatives may still obtain the advantages of the techniques described herein. One example of an improved process flow for forming an MIM stack of an RERAM cell is shown in FIG. 2. However, other process flows may also be utilized.

Prior to performing the techniques described herein, one or more layers used to form the RERAM cell may be provided on a substrate utilizing any of a wide variety of substrate processing techniques to achieve the structure shown. The substrates utilized with the techniques disclosed herein may be any substrates for which the etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including various structures and layers formed.

Figure 1A:
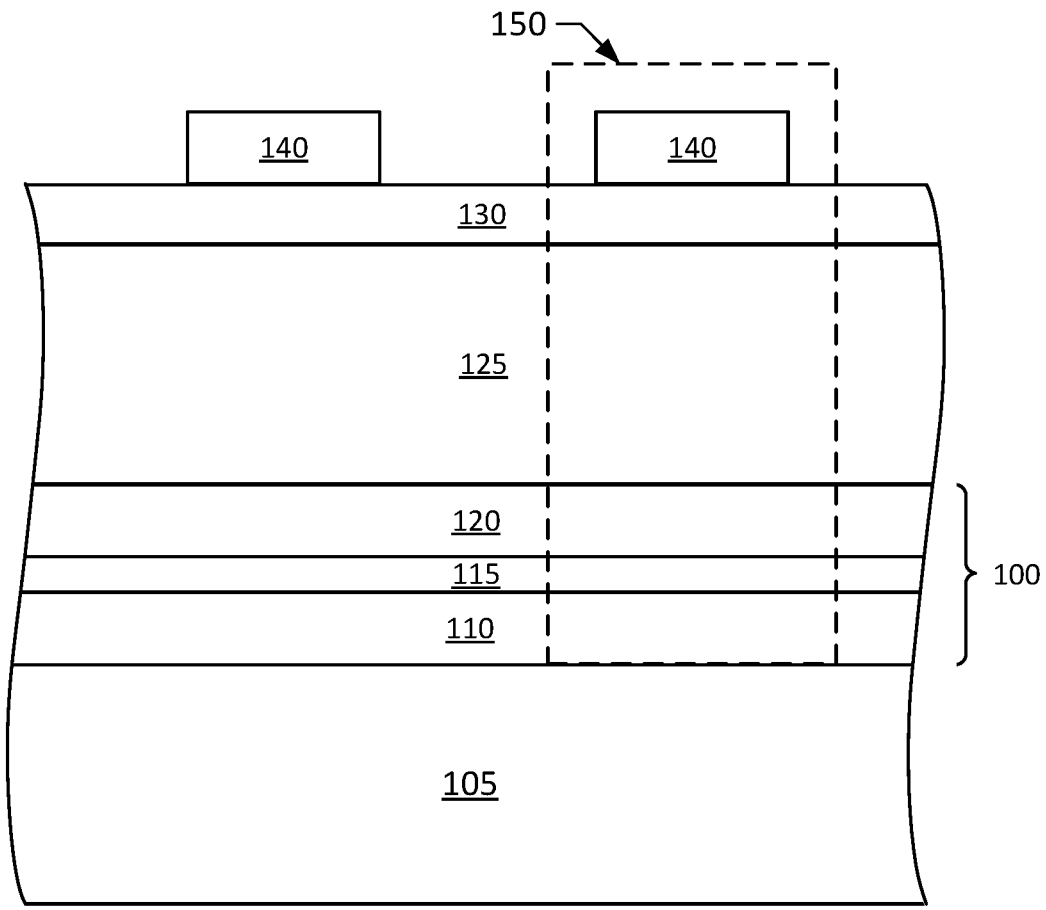
FIGS. 1A-1E (Prior Art) illustrate a conventional process flow for forming an MIM stack of an RERAM cell.
Figure 1B:
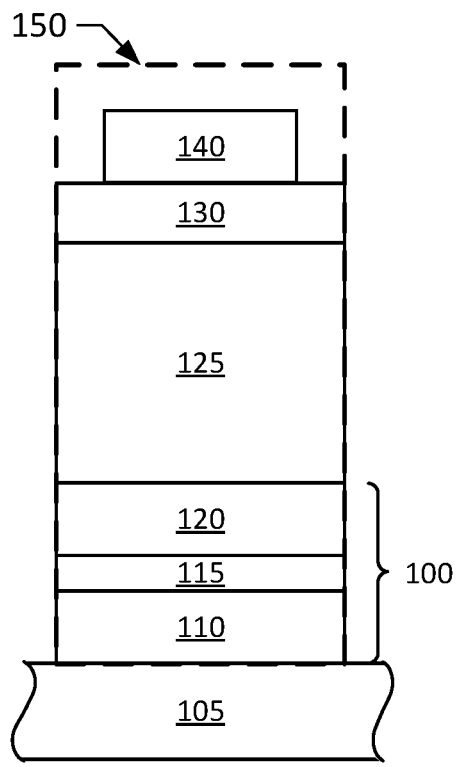
Figure 1C:
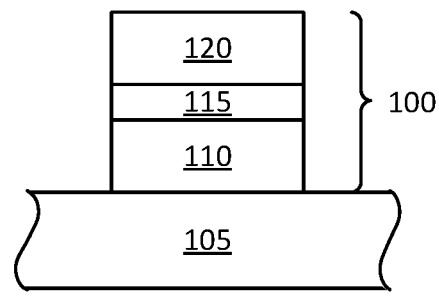
Figure 1D:
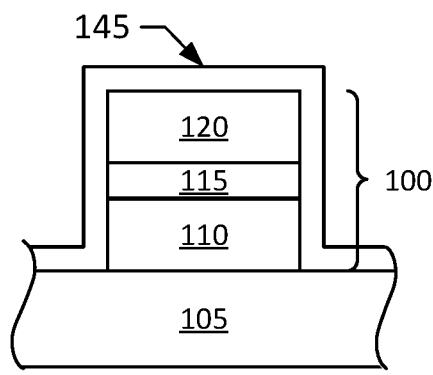
Figure 1E:
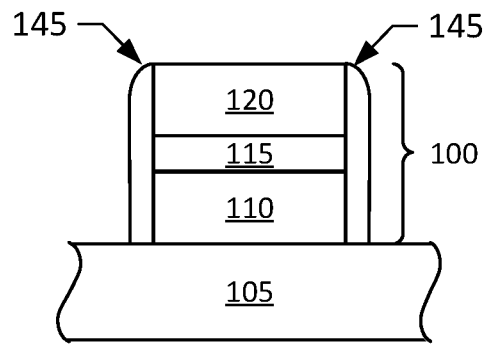
Figure 2A:
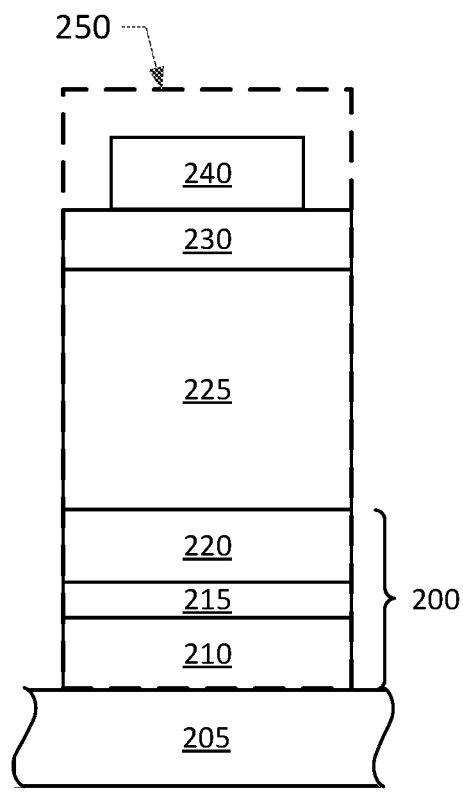
FIGS. 2A-2C illustrate an improved process flow for forming an MIM stack of an RERAM cell in accordance with techniques disclosed herein.
Figure 2B:
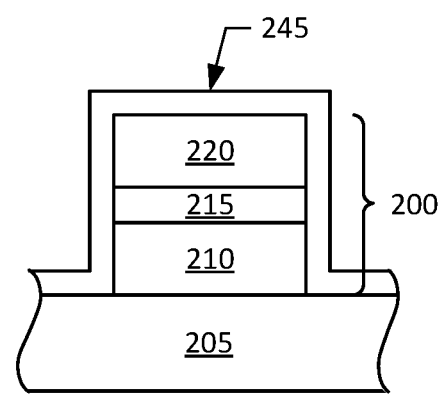
Figure 2C:
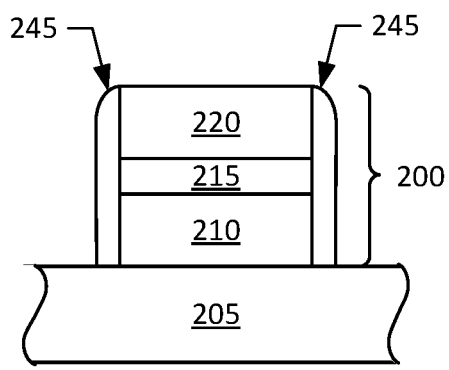

FIGS. 2A-2C illustrate one example of an improved process flow for forming a Metal-Insulator-Metal (MIM) stack for an RERAM cell in accordance with the techniques described herein. Similar to the conventional process flow shown in FIGS. 1A-1E, FIGS. 2A-2C illustrate example process steps that may be performed on a portion 250 of a substrate having one or more layers formed thereon to form an MIM stack 200 for one RERAM cell. Although one example of such layers is shown in FIGS. 2A-2C, a skilled artisan would recognize how the techniques described herein may be performed on substrates on which additional and/or alternative layers are formed above and/or below the MIM stack layers.

As shown in FIG. 2A, a bottom electrode 210 layer, a memory cell dielectric 215 layer and a top electrode 220 layer are formed on one or more underlying layers 205. As noted above, underlying layers 205 may include any number and/or type of layers and/or structures typically used to form an RERAM cell. The underlying layers 205 may generally include a substrate having one or more semiconductor processing layers formed thereon. Source/drain regions for one or more RERAM cells may be formed within the substrate, and one or more RERAM cell gates may be formed on the substrate between respective source/drain regions. Underlying layers 205 may also include other layers, such as one or more dielectric layer(s) formed on the substrate and one or more conductive plugs connecting the subsequently formed MIM stack(s) 200 and overlying metal layers (not shown) to the source/drain regions of the RERAM cell(s).

The memory cell dielectric 215 layer is implemented with a high-k dielectric material. Examples of high-k dielectrics suitable for the memory cell dielectric 215 layer include, but are not limited to, metal oxides such as, for example, hafnium oxide ($HfO_2$), any doped $HfO_2$ materials, hafnium zirconium oxide (HfZrO), tantalum oxide (TaOx), aluminum oxide (AlOx), zirconium oxide (ZrOx), titanium oxide (TiOx) and their mixtures. The top electrode 220 layer and bottom electrode 210 layer may be, in an exemplary embodiment, implemented with a barrier metal material (such as, e.g., TiN). It will be recognized, however, that TiN is merely an exemplary material and other electrode materials may be utilized, such as tantalum nitride, ruthenium, etc. In one example embodiment, the top electrode 220 layer is comprised of 5-75 nm of TiN, the memory cell dielectric 215 layer is comprised of 3-20 nm of $HfO_2$, and the bottom electrode 210 layer is comprised of 25-75 nm of TiN.

Although specific examples are provided above, one skilled in the art would recognize how other materials and/or layer thicknesses could be used to form the top electrode 220 layer, the memory cell dielectric 215 layer and/or the bottom electrode 210 layer while practicing the techniques described herein. As described in more detail below, the top electrode 220 layer, the memory cell dielectric 215 layer and the bottom electrode 210 layer may be subsequently etched to form MIM stack(s) 200 for one or more RERAM cells.

Prior to etching the MIM stack(s) 200, one or more overlying layers may be formed on the top electrode 220 layer. In the example embodiment shown in FIG. 2, an organic planarization layer (OPL) 225, an anti-reflective coating (ARC) layer 230 and a patterning layer 240 are formed on the top electrode 220 layer to pattern the stack. OPL 225 may include, but is not limited to, 50-400 nm. ARC layer 230 may include, but is not limited to, 5-50 nm. The ARC layer 230 may also be replaced by a dielectric layer with an ARC layer on top, for example, a low temperature oxide with a bottom ACR layer on top. The patterning layer 240 may be a patterned photo resist layer, a patterned hard mask layer or another patterned layer. The OPL 225, ARC layer 230 and patterning layer 240 may be formed from a variety of materials commonly used for such purpose utilizing known semiconductor processing steps. Once the patterning layer 240 is formed, the layers shown in FIG. 2A may be etched to form MIM stack(s) 200 for one or more RERAM cells.

The etch process used to form the MIM stack(s) 200 may be implemented as one or more plasma etch process steps using one or more plasma etch chemistries. In addition, the etch process may be performed in one or more plasma etch tools or plasma etch chambers. In one exemplary preferred embodiment, the etch of the MIM stack(s) 200 is performed in a single plasma etch chamber. It will be recognized that a wide range of plasma etch tools may be used to etch the MIM stack 200. For example, the plasma etch tool may be an inductively coupled plasma (ICP) etch tool, a capacitively coupled plasma (CCP) etch tool, a microwave plasma etch tool, or other etch tools. Additional examples of suitable plasma etch tools are discussed below in reference to FIG. 4.

In one example, the etch utilized to etch the MIM stack 200 may be a plasma etch using any of a variety of etch gases, including but not limited to boron trichloride ($BCl_3$), chlorine ($Cl_2$), helium (He), argon (Ar), hydrogen (H2), sulfur dioxide ($SO_2$), oxygen ($O_2$), nitrogen trifluoride ($NF_3$), sulfur hexafluoride ($SF_6$), carbon tetrafluoride ($CF_4$), nitrogen ($N_2$), etc.

Once the top electrode 220 layer, memory cell dielectric 215 layer and bottom electrode 210 layer are etched to form the MIM stack(s) 200, the MIM stacks are encapsulated with an encapsulation layer 245. In some embodiments, the encapsulation layer 245 may comprise a non-oxygen-containing dielectric material such as, for example, silicon (S)

or silicon nitride (SiN). Other exemplary materials include, but are not limited to, organic polymers (such as for example those made in a plasma chamber from precursors such as $CH_4$, $C_4F_6$, $C_4F_8$, $CH_3F$, etc.). In other embodiments, the encapsulation layer 245 may comprise an oxygen-containing dielectric material such as, for example, oxynitride (ON) silicon oxynitride (SiON) and silicon oxycarbonitride (SiOCN). As shown in FIG. 2B, the encapsulation layer 245 is deposited onto the MIM stack(s) 200 and surrounding surfaces of the underlying layers 205. In some embodiments, a relatively thin encapsulation layer 245 ranging between 2 and 50 nm may be deposited, and even more preferably between 4 and 10 nm.

In the process step shown in FIGS. 2B, the encapsulation layer 245 is deposited onto the MIM stack 200 and surrounding surfaces of the underlying layers 205 in-situ while the substrate remains in the plasma etch chamber. The encapsulation layer 245 provides a layer which protects the MIM stack from oxygen ingress. This protection may provide protection from oxygen ingress that may occur from subsequent process steps and also from ingress that may result from exposure of the MIM stack to atmospheric conditions.

The encapsulation layer 245 may be deposited in a single step, in multiple steps or by a cyclic process. In some embodiments, one or more silicon containing precursors (such as, for example, silicon tetrachloride ($SiCl_4$), silicon tetrafluoride ($SiF_4$), etc.) may be used to deposit the encapsulation layer 245 onto the MIM stack 200 (and surrounding surfaces) in the plasma etch chamber. Other silicon precursors may be used such as silanes, other silicon tetrahalides, etc. In one example embodiment, a silicon tetrachloride ($SiCl_4$) precursor may be used within the plasma etch chamber to deposit a silicon nitride (SiN) encapsulation layer 245. The encapsulation layer may be comprised of other materials, such as for example, but not limited to, silicon oxynitride (SiON) or silicon. A variety of deposition processes may be used to form the layer, and in one embodiment, an atomic layer deposition process may be utilized. The atomic layer deposition process may be performed in a plasma etch chamber.

A wide range of parameters may be tuned for the deposition of the encapsulation layer 245 in the plasma etch chamber including, for example, gas flow (e.g., $SiCl_4$, $SiF_4$, $H_2$, Ar, $N_2$, He, $Cl_2$, etc.), high frequency (HF)/low frequency (LF) power settings, continuous wave/pulsed plasma, pressure settings and chuck temperature. In one example embodiment, process conditions for depositing the encapsulation layer 245 may include, but are not limited to, gas flows of 3-50 standard cubic centimeters per minute (SCCM) $SiCl_4$, 0-250 SCCM $H_2$, and 200-500 SCCM Ar; pressures between 2-300 milliTorr (mT); HF/LF power settings of 200-1000 W; and chuck temperatures between 0-100° C. The techniques utilized herein advantageously utilize the same process chamber within which the MIM stack is etched to also perform the deposition. Thus, the particular chemistry utilized to generate an encapsulation layer may vary depending upon the particular gases available within the etch process chamber. Thus, it will be recognized that the particular encapsulation layer deposited (and the process used for such deposition) may depend upon the particular gases that are available in the etch chamber used to etch the MIM stack. One skilled in the art, with the benefit of this disclosure, may thus coordinate the MIM stack etch (and the chemistries utilized) with the particular encapsulation deposition process (and the chemistries utilized therein).

In some embodiments, an optional post deposition treatment may be performed in-situ in the plasma etch chamber, or ex-situ in another processing chamber, to modify the deposition of the encapsulation layer 245. After depositing the encapsulation layer 245, for example, an in-situ thermal treatment may be performed in the plasma etch chamber to expose the encapsulation layer 245 to Ar, $N_2$, or He.

Once the encapsulation layer 245 is deposited (and optionally treated), another etch process (e.g., a spacer etch) may be performed in the plasma etch chamber to remove the encapsulation layer 245 from a top surface of the MIM stack 200 and from the surrounding surfaces of the underlying layers 205, as shown in FIG. 2C. The etch process used to perform the spacer etch may generally be implemented as one or more plasma etch process steps using one or more plasma etch chemistries. The spacer etch may be performed in the same process chamber utilized to etch the MIM stack and deposit the encapsulation layer. Alternatively, the spacer etch may be performed in a different process chamber. The spacer etch may also remove any remaining etch byproducts of the OPL 225 etch, the ARC layer 230 etch or the MIM stack 200 etch.

In some embodiments, the etch recipe used to etch the encapsulation layer 245 may include an oxygen-free plasma etch chemistry. In some embodiments, the oxygen-free plasma etch chemistry may be a hydrofluorocarbon or fluorocarbon-based plasma etch chemistry. In one embodiment, the encapsulation dielectric is SiN and the plasma etch chemistry utilized in the spacer etch is $C_4H_9F$, $H_2$, and Ar. Other etch chemistries may include Cl2, HBr, C4F8, CF4, C4F6, C4F8, etc. By etching the encapsulation layer 245 with an oxygen-free etch chemistry, the impact of the spacer etch on oxygen vacancies in the memory cell dielectric 215 is minimized.

In some embodiments, RERAM cell formation may be completed by forming one or more dielectric layers above and around the MIM stack 200, forming trenches (or vias) within the dielectric layer(s) and filling the trenches with a conductor to form contacts with the MIM stack 200 and source/drain regions of the RERAM cell. Other processing steps may also be performed as known in the art.

Figure 3:
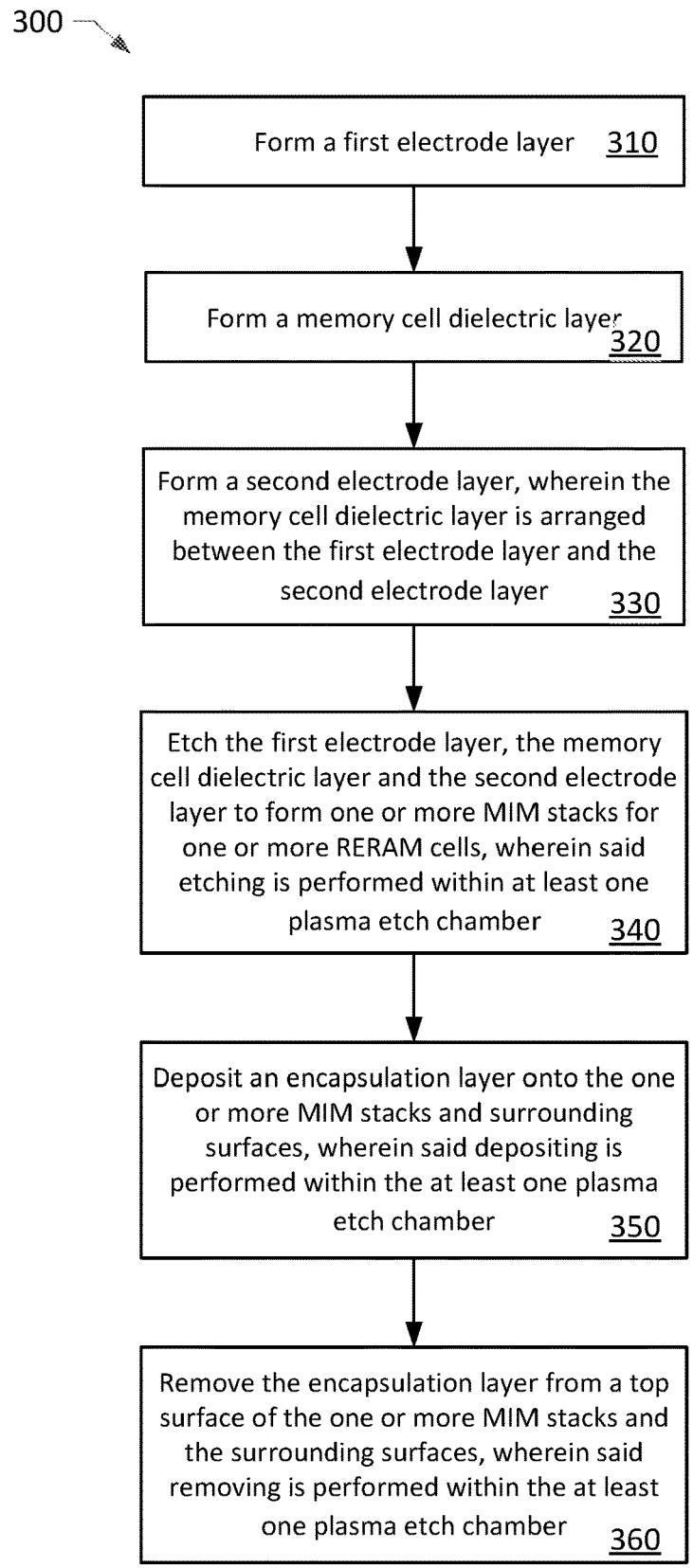
FIG. 3 is a flowchart diagram illustrating one embodiment of a method to form an MIM stack of an RERAM cell in accordance with the techniques disclosed herein.

FIG. 3 illustrates one embodiment of a method 300 that may be used to form an MIM stack of an RERAM cell in accordance with the techniques disclosed herein. In some embodiments, the method 300 may form a first electrode layer (in step 310), form a memory cell dielectric layer (in step 320), and form a second electrode layer (in step 330), where the memory cell dielectric layer is arranged between the first electrode layer and the second electrode layer. The memory cell dielectric layer formed in step 320 may generally comprise a metal oxide selected from a group comprising of hafnium oxide (HfO), hafnium zirconium oxide (HfZrO), tantalum oxide (TaOx), aluminum oxide (AlOx), zirconium oxide (ZrOx) or titanium oxide (TiOx) and their mixtures.

In step 340, the method 300 etches the first electrode layer, the memory cell dielectric layer and the second electrode layer to form one or more Metal-Insulator-Metal (MIM) stacks for one or more RERAM cells. As noted above, the etching performed in step 340 may be performed within at least one plasma etch chamber using one or more plasma etch chemistries.

In step 350, the method 300 deposits an encapsulation layer onto the one or more MIM stacks and surrounding surfaces. In some embodiments, the deposition performed in step 350 may be performed in-situ within the same plasma etch chamber (i.e., the at least one plasma etch chamber) in which the etching step 340 was performed. In some embodiments, one or more silicon precursors (such as silicon tetrachloride, $SiCl_4$, or silicon tetrafluoride, $SiF_4$) may be provided to the at least one plasma etch chamber to deposit the encapsulation layer onto the one or more MIM stacks and the surrounding surfaces in step 350. In some embodiments, the encapsulation layer deposited in step 350 may comprise a non-oxygen-containing dielectric material such as, for example, silicon (S) or silicon nitride (SiN). In other embodiments, the encapsulation layer may comprise an oxygen-containing dielectric material such as, for example, oxynitride (ON) or silicon oxynitride (SiON).

In step 360, the method 300 removes the encapsulation layer from a top surface of the one or more MIM stacks and the surrounding surfaces. In some embodiments, the removing performed in step 360 may be performed in-situ within the same plasma etch chamber (i.e., the at least one plasma etch chamber) in which the etching step 340 and the depositing step 350 were performed. In some embodiments, an oxygen-free plasma etch chemistry may be used within the at least one plasma etch chamber to remove the encapsulation layer from the top surface of the one or more MIM stacks and the surrounding surfaces. In some embodiments, the oxygen-free plasma etch chemistry may comprise a hydrofluorocarbon or fluorocarbon-based plasma etch chemistry.

The techniques described herein improve the oxygen content control in an RERAM cell, while also maintaining throughput. More specifically, the techniques described herein prevent ingress of oxygen into the memory cell dielectric 215 during subsequent substrate processing. Unlike the conventional process flow shown in FIGS. 1A-1E, throughput is improved in the process flow shown in FIGS. 2A-2C and the method steps shown in FIG. 3 by depositing the encapsulation layer 245 in-situ while the substrate remains in the plasma etch chamber used to etch the MIM stack 200.

It is noted that the techniques described herein may be utilized within a wide range of processing equipment including plasma processing systems. For example, the techniques may be utilized with plasma etch processing systems, plasma deposition processing systems, other plasma processing systems, and/or other types of processing systems.

Figure 4:
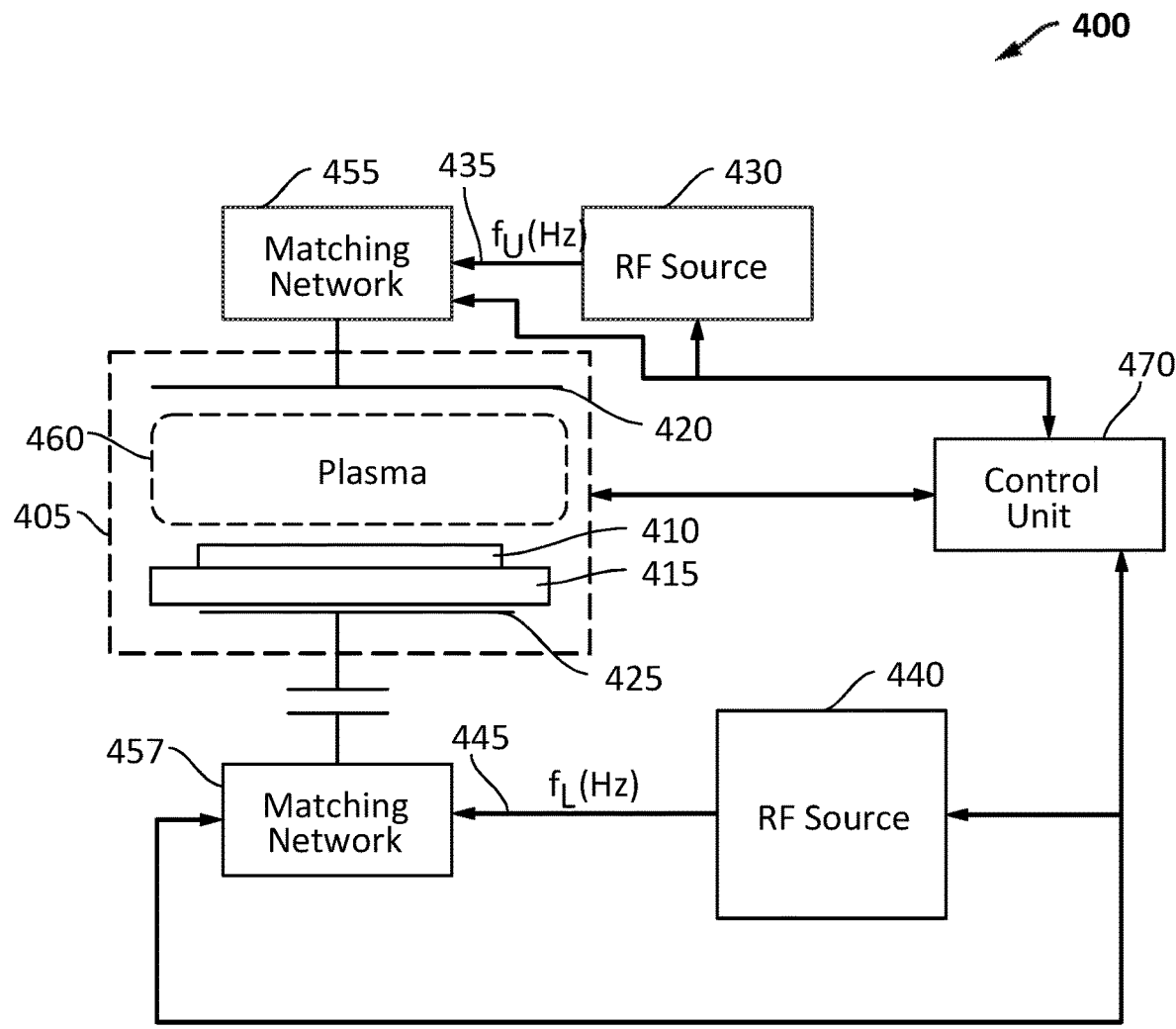
FIG. 4 is a block diagram illustrating one embodiment of a plasma processing system 400 in which the process flow shown in FIGS. 2A-2C and the method shown in FIG. 3 may be performed.

FIG. 4 provides one example embodiment for a plasma processing system 400 that can be used with respect to the disclosed techniques and is provided only for illustrative purposes. The plasma processing system 400 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems.

The plasma processing system 400 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 400 is well known, and the particular structure provided herein is merely of illustrative purposes. It will be recognized that different and/or additional plasma process systems may be implemented while still taking advantage of the techniques described herein.

Looking in more detail to FIG. 4, the plasma processing system 400 may include a process chamber 405. As is known in the art, process chamber 405 may be a pressure controlled chamber. A substrate 410 (in one example a semiconductor wafer) may be held on a stage or chuck 415. An upper electrode 420 and a lower electrode 425 may be provided as shown. The upper electrode 420 may be electrically coupled to an upper radio frequency (RF) source 430 through an upper matching network 455. The upper RF source 430 may provide an upper frequency voltage 435 at an upper frequency ($f_U$). The lower electrode 425 may be electrically coupled to a lower RF source 440 through a lower matching network 457. The lower RF source 440 may provide a lower frequency voltage 445 at a lower frequency ($f_L$). Though not shown, it will be known by those skilled in the art that a voltage may also be applied to the chuck 415.

Components of the plasma processing system 400 can be connected to, and controlled by, a control unit 470 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that control unit 470 may be coupled to various components of the plasma processing system 400 to receive inputs from and provide outputs to the components.

The control unit 470 can be implemented in a wide variety of manners. For example, the control unit 470 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 460 in the process chamber 405 when applying power to the system from the upper radio frequency (RF) source 430 and the lower RF source 440. Further, as is known in the art, ions generated in the plasma 460 may be attracted to the substrate 410. The generated plasma can be used for processing a target substrate (such as substrate 410 or any material to be processed) in various types of treatments such as, but not limited to, plasma etching and deposition.

Application of power results in a high-frequency electric field being generated between the upper electrode 420 and the lower electrode 425. Processing gas delivered to process chamber 405 can then be dissociated and converted into a plasma. As shown in FIG. 4, the exemplary system described utilizes both upper and lower RF sources. For example, high-frequency electric power, for an exemplary capacitively coupled plasma system, in a range from about 3 MHz to 150 MHz or above may be applied from the upper RF source 430 and a low frequency electric power in a range from about 0.2 MHz to 40 MHz can be applied from the lower RF source. Different operational ranges can also be used. Further, it will be recognized that the techniques described herein may be utilized within a variety of other plasma systems. In one example system, the sources may be switched (e.g., higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that one or more deposition processes can be used to form one or more of the material layers described herein. For example, one or more depositions can be implemented using chemical vapor deposition (CVD), plasma enhanced CVD (PECVD), physical vapor deposition (PVD), atomic layer deposition (ALD), and/or other deposition processes. In one example plasma deposition process, a precursor gas mixture can be used including but not limited to silicon containing gases, hydrocarbons, fluorocarbons, or nitrogen containing hydrocarbons in combination with one or more dilution gases (e.g., argon, nitrogen, etc.) at a variety of pressure, power, flow and temperature conditions. In addition, one or more etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases.

In addition, operating variables for process steps can be adjusted to control the various deposition and/or etch processes described herein. The operating variables may include, for example, the chamber temperature, chamber pressure, flowrates of gases, types of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of forming a resistive random access memory (RERAM), comprising:
   forming a first electrode layer;
   forming a memory cell dielectric layer;
   forming a second electrode layer, wherein the memory cell dielectric layer is arranged between the first electrode layer and the second electrode layer;

etching the first electrode layer, the memory cell dielectric layer and the second electrode layer to form one or more Metal-Insulator-Metal (MIM) stacks for one or more RERAM cells, wherein said etching is performed within at least one plasma etch chamber; and depositing an encapsulation layer onto the one or more MIM stacks and surrounding surfaces, wherein said depositing is performed within the at least one plasma etch chamber.

2. The method of claim 1, wherein the memory cell dielectric layer comprises a metal oxide selected from a group consisting of hafnium oxide (HfO), hafnium zirconium oxide (HfZrO), tantalum oxide (TaOx), aluminum oxide (AlOx), zirconium oxide (ZrOx) or titanium oxide (TiOx) and their mixtures.

3. The method of claim 1, wherein the encapsulation layer comprises silicon (Si), silicon nitride, (SiN) oxynitride (ON), or silicon oxynitride (SiON).

4. The method of claim 1, wherein the encapsulation layer comprises an organic material.

5. The method of claim 1, wherein said depositing comprises providing one or more precursors to the at least one plasma etch chamber to deposit the encapsulation layer onto the one or more MIM stacks and the surrounding surfaces.

6. The method of claim 5, wherein the one or more silicon precursors comprise silicon containing gases.

7. The method of claim 5, wherein the one or more silicon precursors are selected from a group consisting of silicon tetrachloride ($SiCl_4$) and silicon tetrafluoride ($SiF_4$).

8. The method of claim 1, further comprising performing a spacer etch process to remove the encapsulation layer from a horizontal surface of the one or more MIM stacks and the surrounding surfaces.

9. The method of claim 8, wherein the spacer etch also removes any etch byproducts remaining after etching the first electrode layer, the memory cell dielectric layer and the second electrode layer.

10. The method of claim 8, wherein said performing a spacer etch process comprises using an oxygen-free plasma etch chemistry within the at least one plasma etch chamber to remove the encapsulation layer from the horizontal surface of the one or more MIM stacks and the surrounding surfaces.

11. The method of claim 8, wherein said depositing an encapsulation layer prevents ingress of oxygen into the memory cell dielectric layer when removing the encapsulation layer from the horizontal surface of the one or more MIM stacks and the surrounding surfaces by leaving the encapsulation layer on sidewalls of the MIM stack.

12. A method of forming a resistive random access memory (RERAM), comprising:

forming a first electrode layer;

forming a memory cell dielectric layer;

forming a second electrode layer, wherein the memory cell dielectric layer is arranged between the first electrode layer and the second electrode layer;

etching the first electrode layer, the memory cell dielectric layer and the second electrode layer to form one or more Metal-Insulator-Metal (MIM) stacks for one or more RERAM cells, wherein said etching is performed within at least one plasma etch chamber;

depositing an encapsulation layer onto the one or more MIM stacks and surrounding surfaces, wherein said depositing is performed within the at least one plasma etch chamber; and removing the encapsulation layer from a top surface of the one or more MIM stacks and the surrounding surfaces, wherein said removing is performed within the at least one plasma etch chamber.

13. The method of claim 12, wherein the memory cell dielectric layer comprises a metal oxide selected from a group consisting of hafnium oxide (HfO), hafnium zirconium oxide (HfZrO), tantalum oxide (TaOx), aluminum oxide (AlOx), zirconium oxide (ZrOx) or titanium oxide (TiOx) and their mixtures.

14. The method of claim 12, wherein the encapsulation layer comprises silicon (Si) or silicon nitride (SiN).

15. The method of claim 12, wherein the encapsulation layer comprises oxynitride (ON) or silicon oxynitride (SiON).

16. The method of claim 12, wherein said depositing comprises providing one or more silicon precursors to the at least one plasma etch chamber to deposit the encapsulation layer onto the one or more MIM stacks and the surrounding surfaces.

17. The method of claim 16, wherein the one or more silicon precursors comprise silicon containing gases.

18. The method of claim 16, wherein the one or more silicon precursors are selected from a group consisting of silicon tetrachloride ($SiCl_4$) and silicon tetrafluoride ($SiF_4$).

19. The method of claim 16, wherein the one or more silicon precursors comprise silicon tetrachloride ($SiCl_4$).

20. The method of claim 12, wherein said removing comprises using an oxygen-free plasma etch chemistry within the at least one plasma etch chamber to remove the encapsulation layer from the top surface of the one or more MIM stacks and the surrounding surfaces.

* * * * *